(12) United States Patent
Sankar et al.

(10) Patent No.: US 10,728,080 B2
(45) Date of Patent: Jul. 28, 2020

(54) POLAR CODES AND MODULATION MAPPINGS

(71) Applicant: QUALCOMM Incorporated, San Diego, CA (US)

(72) Inventors: Hari Sankar, San Diego, CA (US); Jing Jiang, San Diego, CA (US); Alexei Yurievitch Gorokhov, San Diego, CA (US); Joseph Binamira Soriaga, San Diego, CA (US); Brian Banister, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/428,879

(22) Filed: Feb. 9, 2017

(65) Prior Publication Data

US 2017/0338996 A1 Nov. 23, 2017

Related U.S. Application Data

(60) Provisional application No. 62/339,769, filed on May 20, 2016.

(51) Int. Cl.
*H04L 27/36* (2006.01)
*H04L 1/00* (2006.01)
(Continued)

(52) U.S. Cl.
CPC ............ *H04L 27/36* (2013.01); *H03M 13/13* (2013.01); *H03M 13/251* (2013.01);
(Continued)

(58) Field of Classification Search
CPC ...... H04L 27/36; H04L 1/0068; H04L 1/0071; H04L 27/20; H04L 1/0057; H04B 10/532
See application file for complete search history.

(56) References Cited

U.S. PATENT DOCUMENTS

2006/0036922 A1* 2/2006 Hong ............... H04L 1/0668 714/748
2011/0085624 A1* 4/2011 Djordjevic ......... H04B 10/532 375/341

(Continued)

FOREIGN PATENT DOCUMENTS

CN 103023618 B 4/2015

OTHER PUBLICATIONS

Honda J., et al., "Polar Coding Without Alphabet Extension for Asymmetric Models", IEEE Transactions on Information Theory, vol. 59, No. 12, Dec. 2013, pp. 7829-7838.
(Continued)

*Primary Examiner* — Sam K Ahn
*Assistant Examiner* — Amneet Singh
(74) *Attorney, Agent, or Firm* — Holland & Hart LLP

(57) ABSTRACT

Methods, systems, and devices for wireless communication are described. A transmitter, such as a user equipment and/or a base station, may perform polar coding to encode bits. The polar coding may be associated with a plurality of component channels associated with a polar code length. The transmitter may interleave the encoded bits. The transmitter may map the interleaved encoded bits to a modulation symbol. The interleaving and mapping of each encoded bit may be based on an asymmetry of a polar code construction. The transmitter may transmit the interleaved encoded bits based on the mapping.

27 Claims, 14 Drawing Sheets

(51) Int. Cl.
   *H03M 13/25* (2006.01)
   *H03M 13/13* (2006.01)
   *H03M 13/35* (2006.01)
   *H04L 27/20* (2006.01)

(52) U.S. Cl.
   CPC ........ *H03M 13/356* (2013.01); *H04L 1/0041* (2013.01); *H04L 1/0058* (2013.01); *H04L 1/0071* (2013.01); *H04L 27/20* (2013.01); *H04L 1/0057* (2013.01)

(56) References Cited

U.S. PATENT DOCUMENTS

| | | | |
|---|---|---|---|
| 2012/0257895 A1* | 10/2012 | Djordjevic | H04B 10/548 398/65 |
| 2015/0091742 A1 | 4/2015 | Ionita et al. | |
| 2015/0092886 A1 | 4/2015 | Ionita et al. | |
| 2016/0204811 A1 | 7/2016 | Goela et al. | |
| 2016/0285479 A1* | 9/2016 | El-Khamy | H03M 13/6368 |

OTHER PUBLICATIONS

ISA/EP, International Search Report and Written Opinion of the International Searching Authority, Int'l Application No. PCT/US2017/032349, dated Jul. 25, 2017, European Patent Office, Rijswijk, NL, 14 pgs.

Mahdavifar et al., "Polar Coding for Bit-Interleaved Coded Modulation," IEEE Transactions on Vehicular Technology, Jan. 2015 (enhancement of this document was done on Dec. 12, 2015), 14 pgs., DOI: 10.1109/TVT.2015.2443772, XP055390413, Research Gate and Institute of Electrical and Electronics Engineers.

Peiyao et al., "Design of Polar Coded 64-QAM," 2016 9th International Symposium on Turbo Codes and Iterative Information Processing (ISTC), IEEE, Sep. 5, 2016, pp. 251-255, XP032981303,. DOI: 10.1109/ISTC.2016.7593115, Institute of Electrical and Electronics Engineers.

Seidl "Polar-Coded Modulation," IEEE Transactions on Communications, Oct. 1, 2013, pp. 4108-4119, vol. 61, No. 10, XP055390357, ISSN: 0090-6778, DOI: 10.1109/TCOMM.2013.090513.130433, Institute of Electrical and Electronics Engineers, Piscataway, NJ USA.

Shin et al., "Mapping Selection and Code Construction for 2m-ary Polar-Coded Modulation," IEEE Communications Letters, Jun. 2012, 4 pgs., vol. 16, No. 6, XP011447252, ISSN: 1089-7798, DOI: 10.1109/LCOMM.2012.040912.120070, IEEE Service Center, Piscataway, NJ USA.

Tavildar, "Bit-Permuted Coded Modulation for Polar Codes," Sep. 30, 2016, 6 pgs, XP055390429, DOI: 10.1109/WCNCW.2017. 7919038, ISBN: 978-1-5090-5908-9. Retrieved from the Internet: URL:https://arxiv.org/pdf/1609.09786.pdf [retrieved on Jul. 12, 2017].

* cited by examiner

Scheme 1

Scheme 2

300-a

Scheme 1

Scheme 2

POLAR CODES AND MODULATION MAPPINGS

CROSS REFERENCES

The present Application for Patent claims priority to U.S. Provisional Patent Application No. 62/339,769 by Sankar, et al., entitled "POLAR CODES AND MODULATION MAPPINGS," filed May 20, 2016, assigned to the assignee hereof, and is hereby expressly incorporated by reference herein in its entirety.

BACKGROUND

The following relates generally to wireless communication, and more specifically to polar codes and modulation mappings.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system). A wireless multiple-access communications system may include a number of base stations, each simultaneously supporting communication for multiple communication devices, which may otherwise be known as user equipment (UE).

Communications in a wireless communication system may include transmission mechanisms where information bits are encoded, modulated, and transmitted from a transmitting device to a receiving device. The information bits may be data bits and/or control bits. Certain encoding mechanisms may use a linear block error correcting code such as a polar code. Existing techniques of encoding and transmitting information bits, however, do not fully leverage the asymmetry of encoded bits produced by polar coding, which can degrade performance.

SUMMARY

The described techniques relate to improved methods, systems, devices, or apparatuses that support polar codes and modulation mappings. Generally, the described techniques provide for a transmitter including a polar coder, an interleaver, and a modulation mapper that cooperate to provide maximal polarization. Increased polarization provides better performance in a polar coded scheme. The interleaver maps specific encoded bits from the polar coder to specific bits of modulation symbols based on a modulation mapping scheme designed to increase polarization for a modulation scheme in use. The interleaver may also interleave the entire coded block across tones or a time-dimension to maximize diversity combining.

In one example, a transmitter (e.g., a base station and/or a user equipment) may perform a polar coding to encode a plurality of bits. The polar coding may be associated with a plurality of component channels (W) associated with a polar code length (N). The transmitter may interleave the encoded bits and map the interleaved encoded bits to a modulation symbol. The transmitter may interleave and map each encoded bit based at least in part on an asymmetry of a polar code construction. The transmitter may then transmit the interleaved encoded bits according to the mapping.

A method of wireless communication is described. The method may include performing polar coding to encode a plurality of bits, the polar coding associated with a plurality of component channels associated with a polar code length, interleaving the encoded bits, mapping the interleaved encoded bits to a modulation symbol, wherein the interleaving and the mapping of each encoded bit are based at least in part on an asymmetry of a polar code construction, and transmitting the interleaved encoded bits based at least in part on the mapping.

An apparatus for wireless communication is described. The apparatus may include means for performing polar coding to encode a plurality of bits, the polar coding associated with a plurality of component channels associated with a polar code length, means for interleaving the encoded bits, means for mapping the interleaved encoded bits to a modulation symbol, wherein the interleaving and the mapping of each encoded bit are based at least in part on an asymmetry of a polar code construction, and means for transmitting the interleaved encoded bits based at least in part on the mapping.

Another apparatus for wireless communication is described. The apparatus may include a processor, memory in electronic communication with the processor, and instructions stored in the memory. The instructions may be operable to cause the processor to perform polar coding to encode a plurality of bits, the polar coding associated with a plurality of component channels associated with a polar code length, interleave the encoded bits, map the interleaved encoded bits to a modulation symbol, wherein the interleaving and the mapping of each encoded bit are based at least in part on an asymmetry of a polar code construction, and transmit the interleaved encoded bits based at least in part on the mapping.

A non-transitory computer readable medium for wireless communication is described. The non-transitory computer-readable medium may include instructions operable to cause a processor to perform polar coding to encode a plurality of bits, the polar coding associated with a plurality of component channels associated with a polar code length, interleave the encoded bits, map the interleaved encoded bits to a modulation symbol, wherein the interleaving and the mapping of each encoded bit are based at least in part on an asymmetry of a polar code construction, and transmit the interleaved encoded bits based at least in part on the mapping.

In some examples of the method, apparatus, or non-transitory computer-readable medium described above, the interleaving comprises: grouping the encoded bits serially according to the asymmetry of the polar code construction. In some examples of the method, apparatus, or non-transitory computer-readable medium described above, the mapping is configured to polarize a reliability of each of the component channels.

In some examples of the method, apparatus, or non-transitory computer-readable medium described above, the mapping is different for different modulation schemes. In some examples of the method, apparatus, or non-transitory computer-readable medium described above, the interleaving comprises: matching a first set of encoded bits associated with a first channel reliability to a first portion of a modulation symbol. Some examples of the method, apparatus, or non-transitory computer-readable medium described above may further include processes, features, means, or instructions for matching a second set of encoded bits associated with a second channel reliability to a second portion of the modulation symbol.

In some examples of the method, apparatus, or non-transitory computer-readable medium described above, the mapping comprises: using at least one of an anti-Gray mapping or a Gray mapping for a quadrature phase shift keying (QPSK) modulation scheme. In some examples of the method, apparatus, or non-transitory computer-readable medium described above, the mapping comprises: using at least one of a natural binary mapping, or a random mapping, or a Gray mapping for a 16-quadrature amplitude modulation (16-QAM) modulation scheme.

In some examples of the method, apparatus, or non-transitory computer-readable medium described above, the mapping comprises: using a Gray mapping or a random mapping for a 2^2M quadrature amplitude modulation (2^2M-QAM) modulation scheme. In some examples of the method, apparatus, or non-transitory computer-readable medium described above, performing polar coding comprises: using a plurality of redundant polar coders to concurrently encode the plurality of bits, wherein each polar coder is associated with a different group of bits from the plurality of bits.

DETAILED DESCRIPTION

Aspects of the disclosure are initially described in the context of a wireless communications system. The disclosure relates to techniques for improving polarization in a polar coding scenario. For example, a device (e.g., a UE and/or a base station) may include a transmitter or transceiver configured to support the disclosed polar coding, interleaving, and modulation mapping techniques. The transmitter may perform polar coding to encode a plurality of information bits. The polar coding may include multiple component channels, and the number of component channels may be based on a polar code length. Some of the component channels may have a different reliability than the other component channels. The transmitter may interleave the encoded bits and map the interleaved/encoded bits to a modulation symbol. The polar code construction may be asymmetric and the asymmetry may be used to interleave and map each encoded bit to achieve maximum polarization. For example, the encoded bits may be grouped serially according to the asymmetry of the polar code construction.

Aspects of the disclosure are initially described in the context of a wireless communications system. Aspects of the disclosure are further illustrated by and described with reference to apparatus diagrams, system diagrams, and flowcharts that relate to polar codes and modulation mappings.

Figure 1:
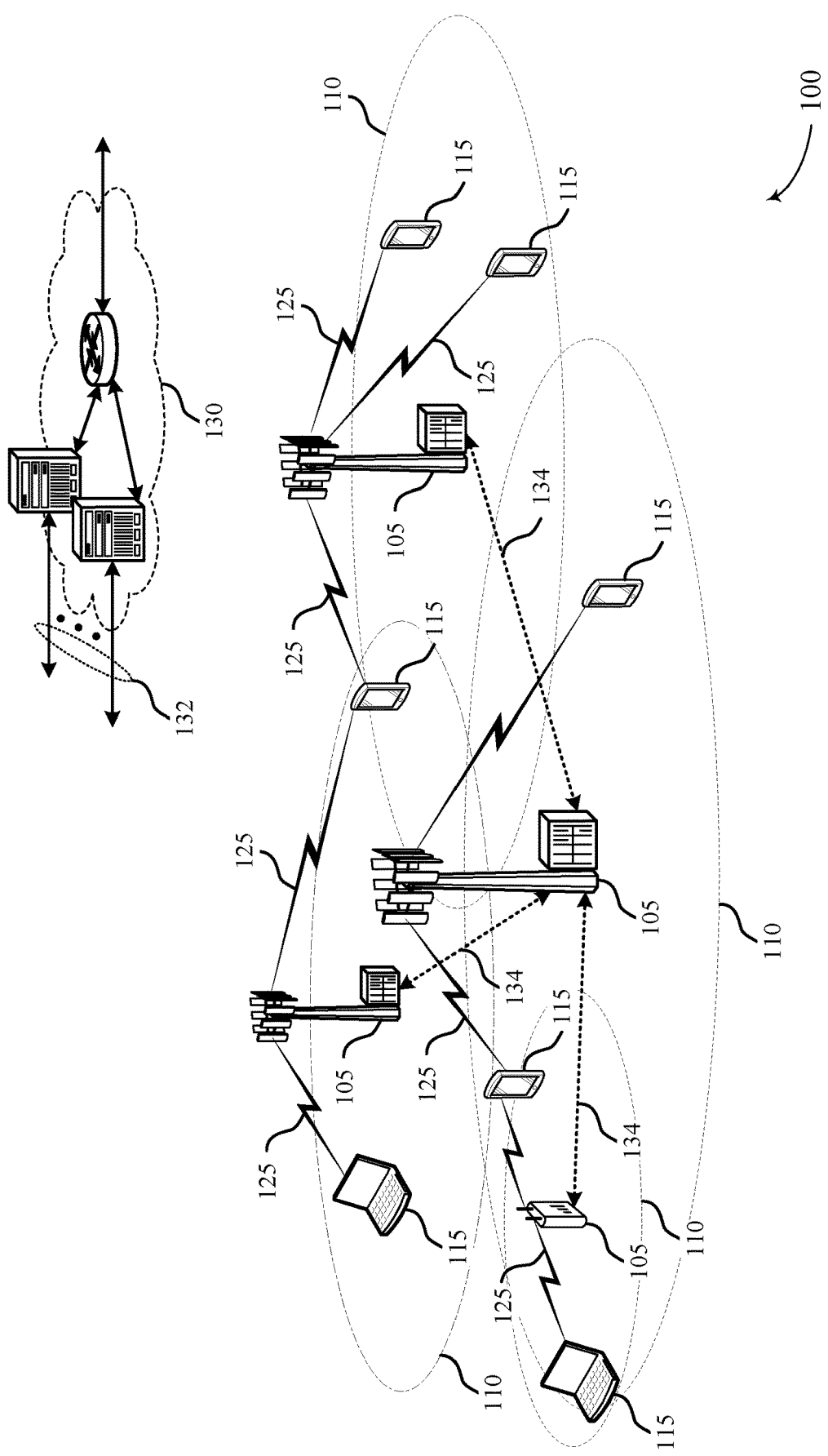
FIG. 1 illustrates an example of a wireless communications system that supports polar codes and modulation mappings in accordance with aspects of the present disclosure.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a LTE (or LTE-Advanced (LTE-A)) network. In some examples, wireless communications system 100 may be an advanced wireless communication system, such as a 5G wireless communication system, a millimeter wave (mmW) wireless communication system, etc.

Base stations 105 may wirelessly communicate with UEs 115 via one or more base station antennas. Each base station 105 may provide communication coverage for a respective geographic coverage area 110. Communication links 125 shown in wireless communications system 100 may include UL transmissions from a UE 115 to a base station 105, or DL transmissions, from a base station 105 to a UE 115. UEs 115 may be dispersed throughout the wireless communications system 100, and each UE 115 may be stationary or mobile. A UE 115 may also be referred to as a mobile station, a subscriber station, a remote unit, a wireless device, an access terminal (AT), a handset, a user agent, a client, or like terminology. A UE 115 may also be a cellular phone, a wireless modem, a handheld device, a personal computer, a tablet, a personal electronic device, a machine type communication (MTC) device, etc.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as eNodeBs (eNBs) 105.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include CDMA systems, TDMA systems, FDMA systems, and OFDMA systems. A wireless multiple-access communications system may include a number of base stations, each simultaneously supporting communication for one or more multiple communication devices, which may be otherwise known as a UE 115.

Wireless communications system 100 may support polar coding techniques for wireless communications. The polar coding may use a polar coding construction that is asymmetric. A transmitting device (e.g., a UE 115 and/or a base station 105) may perform polar coding to encode information bits (e.g., data bits, control bits, etc.). The polar coding may include using a number of component channels (W) that are based on a polar code length (N). The transmitting device may interleave the encoded bits and map the interleaved encoded bits to a modulation symbol. The interleaving and mapping of each bit may be based on the asymmetry of the polar code construction. The transmitter may transmit the interleaved encoded bits according to the mapping.

Figure 2:
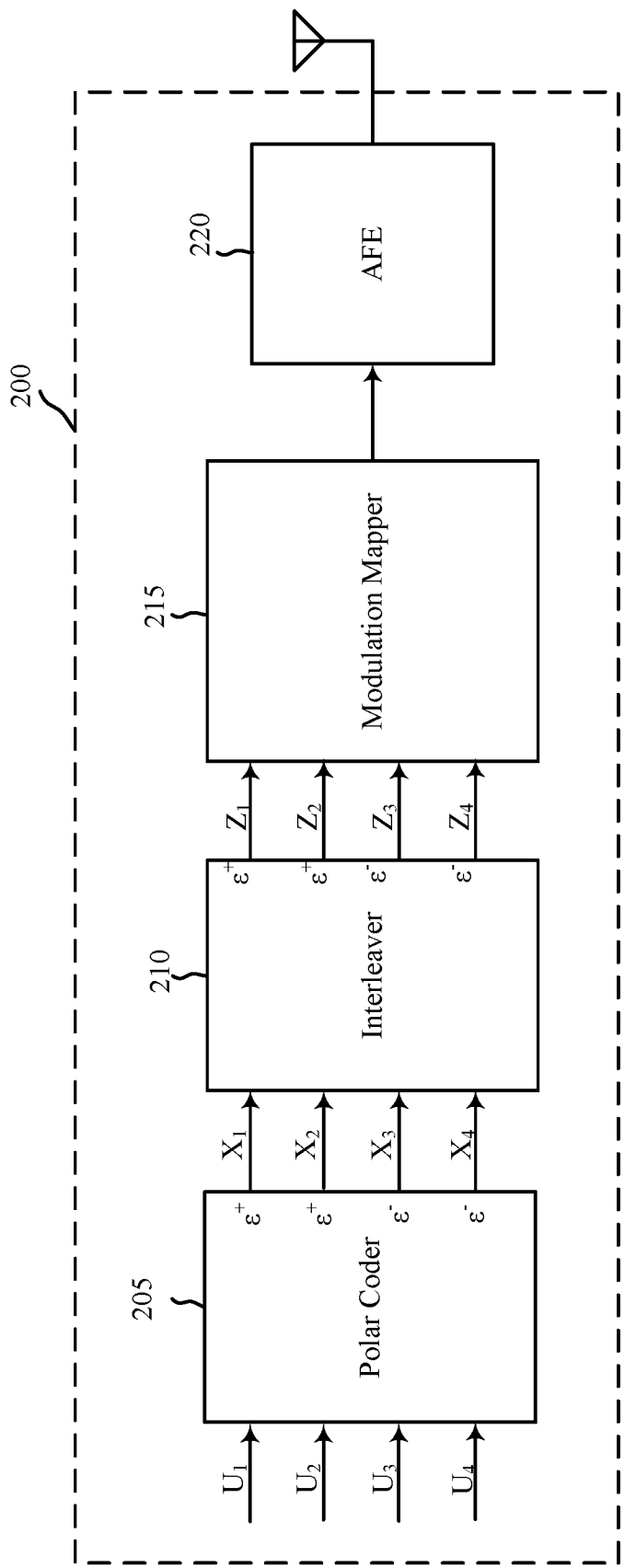
FIG. 2 illustrates an example of a device for wireless communication that supports polar codes and modulation mappings in accordance with aspects of the present disclosure.

FIG. 2 illustrates an example of a device 200 for use in wireless communications that supports polar codes and modulation mappings. In some cases, device 200 may represent aspects of techniques performed by a transmitting device, such as a UE 115 or base station 105 as described with reference to FIG. 1. In some cases, device 200 may be a transmitter, a transceiver, or a sub-component of a transmitter or transceiver. Device 200 may include a polar coder 205, an interleaver 210, a modulation mapper 215, and an analog front end (AFE) 220. Although device 200 is shown having one polar coder 205, it is to be understood that device 200 may include more than one polar coder 205 (i.e., a set of polar coders 205).

As background, the fundamentals of polar coding may begin with a binary-input memoryless channel W: X→Y. The capacity of the channel W may be given as C=I(X; Y), where I represents mutual information between X and Y. In the example of binary-input $0 \leq C \leq 1$, C being the capacity of channel W identified above, the following transformation may start with N copies of channel W. Using a one-to-one mapping from U to X, where $G_{N \times N}$: $\{0, 1\}^N \rightarrow \{0, 1\}^N$, may result in an effective channel $W_{vec}$ being created, where $X^N = U^N \cdot G_{N \times N}$, and $U^N$ represents a vector of bits to be encoded.

Polar coding may be given as $C(W_{vec}) = I(U^N; Y^N) = \sum_{i=1}^{N} I(U_i; Y^N|U^{i-1}) = \sum_{i=1}^{N} C(W_i) = N \cdot C(W)$, where channel $W_i$: $U_i \rightarrow (Y^N, U^{i-1})$. For certain values of the matrix, $G_{N \times N}$, $C(W_i)$ becomes polarized. That is, the linear one-to-one transformation, $G_{N \times N}$, converts N equal capacity channel W's into N channels, $W_i$, with unequal capacity. As N tends to infinity, $C(W_i)$ degenerates to a bi-modal distribution around 0, 1 for binary input—i.e., polarized.

For example, consider the case where N=2, giving $$G_{2 \times 2} = \begin{bmatrix} 1 & 0 \\ 1 & 1 \end{bmatrix}.$$

In the example where W is a binary erasure channel (BEC) with erasure probability "ε." It may be deduced that $U_1 = X_1 \oplus X_2 = Y_1 \oplus Y_2$ and $U_2 = X_2 = X_1 \oplus U_1$. For channel $W_1$: $U_1 \rightarrow Y^N$, the erasure probability may be $\varepsilon^- = 1 - (1-\varepsilon)^2 = 2\varepsilon - \varepsilon^2$. For channel $W_2$: $U_1 \rightarrow Y^N$, the $(Y^N, U_1)$, the erasure probability may be $\varepsilon^+ = \varepsilon^2$ (denoting $W^+ = W_2$ and $W^- = W_1$). This illustrates that channel $W_2$ may be considered to be a better performing channel than channel $W_1$. This operation may be performed recursively, yielding more polarization across N. It is to be understood that the example BEC erasure probability is being used for illustrative purposes only. The described techniques may also be applicable for other channel types (e.g., additive white Gaussian noise (AWGN) channels, fading channels, etc.).

Turning now to the example device 200, polar coder 205 may perform polar coding to encode a plurality of bits, shown as unencoded bits $U_1$-$U_4$. The polar coding may have a polar code length N that defines a number of component channels, also referred to as bit channels, used for polar coding. For ease of explanation and as a non-limiting example only, the polar code length N is four (4) for device 200, corresponding to four component channels and a group of four bits that are encoded in parallel. Each component channel may have an associated reliability, ε, which may correspond to an erasure probability for the channel.

In the example device 200, polar coder 205 may perform polar coding on bits $U_1$-$U_4$ and output encoded bits $X_1$-$X_4$, where polar coder 205 may create polarization of encoded bits, i.e., with higher and lower reliabilities. Each component channel may therefore have a different reliability ε, illustrated as $\varepsilon^+$ for component channels corresponding to encoded bits $X_1$ and $X_2$ and as $\varepsilon^+$ for component channels corresponding to encoded bits $X_3$ and $X_4$. A component channel reliability of $\varepsilon^+$ (e.g., a high erasure probability) represents a low probability that an encoded bit will be successfully decoded after transmission to a receiver over a physical channel, and a reliability of $\varepsilon^-$ (e.g., a low erasure probability) represents a high probability that an encoded bit will be successfully decoded after transmission to a receiver over a physical channel. In some aspects, the component channels are from the interleaver/modulation mapping perspective. That is, the unequal reliability $\varepsilon^+$ and $\varepsilon^-$ may be assumed to come from a modulator, for example. Thus, a modulator may act as a polarizer to some extent.

Interleaver 210 relies on an asymmetry in the polar coding to decide how to connect encoded bits associated with different reliabilities (e.g., $\varepsilon^-$ and $\varepsilon^-$) to $X_1$-$X_4$. Put differently, interleaver 210 reorders the bits output by polar coder 205 based on the asymmetry of the matrix $G_{N \times N}$ of the polar code structure. In some cases, the output of interleaver 210 (e.g., $Z_1$-$Z_4$) may be different than the input of encoded bits.

The order of the encoded bits output by interleaver 210 affects how those bits are mapped to a modulation symbol by modulation mapper 215. For example, in a 16-quadrature amplitude modulation (16-QAM) scheme, the first two bits input to the modulation mapper 215 may control a first dimension of the modulation symbol (e.g., a selected quadrant in a modulation constellation or a position along a first axis of the constellation), and the second two bits input to the modulation mapper 215 may control a second dimension of the modulation symbol (e.g., a position within the selected quadrant or a position along a second axis of the constellation). Interleaver 210 may feed the encoded bits from polar coder 205 into modulation mapper 215 such that bits of similar polarization affect the same dimension of modulation mapping by modulation mapper 215. For example, the encoded bits with a reliability of $\varepsilon^+$ (e.g., $X_1$ and $X_2$) may control the selection of a quadrant or a position along a first axis of the modulation constellation, and the encoded bits with a reliability of $\varepsilon^-$ (e.g., $X_3$ and $X_4$) may control the selection of a position within the selected quadrant or a position along a second axis of the modulation constellation.

Modulation mapper 215 may map the interleaved encoded bits to a modulation symbol. The mapping scheme implemented by modulation mapper 215 may be such that a maximum polarization of the reliability of each component channel is preserved during modulation. Because the polarization of the encoded bits is a result of an asymmetry in the matrix used to encode the bits, both the interleaving scheme and the modulation mapping scheme may be selected according to the asymmetry of the polar code construction. Modulation mapper 215 may select or use a mapping scheme based on the modulation scheme being used. In one example, modulation mapper 215 may use a natural binary mapping or a Gray mapping for a 16-QAM scheme. In another example, modulation mapper 215 may use a Gray mapping or a random mapping for a $2^{2M}$-QAM modulation scheme.

In some aspects, such as for quadrature phase shift keying (QPSK) modulation, anti-Gray mapping may be used (e.g., Gray mapping may make modulated bits unpolarized). For 16-QAM, Gray mapping may polarize the output of log-likelihood ratios (LLRs). As an example, the described techniques may use natural binary mapping on in-phase (I) and quadrature (Q) dimensions independently to increase polarization. Two dimensional (2-D) modulation mappings (e.g., joint with I, Q) may be associated with more complicated demappers, although 2-D modulation mappings may increase polarization further.

In some aspects, QPSK (anti-Gray mapped) and 16-QAM may work with conventional polar code derived from $$G_{2\times 2} = \begin{bmatrix} 1 & 0 \\ 1 & 1 \end{bmatrix}.$$

The described techniques may be extended to generic modulations such as phase shift keying (PSK), amplitude shift keying (ASK), etc. In some aspects, a joint multi-stage decoding receiver (over coding and modulation) may obtain improved performance. One-shot demodulation followed by a polar decoder may be less preferred in some non-Gray mapping cases.

AFE 220 may transmit the interleaved encoded bits as modulated according to the mapping. For example, AFE 220 may transmit the interleaved encoded bits via an antenna, or more than one antennas.

As discussed above, device 200 uses interleaver 210, which may be designed to maximize polarization. Maximizing polarization may result in improved performance for wireless communications. In some examples, it may be helpful to have erasure probabilities (e.g., $\varepsilon_1$ and $\varepsilon_2$) as polarized as possible to start with. The described techniques devise mappings that polarize the reliabilities of the component channels. Based on how the interleaver 210 and the modulation mapper 215 are designed, frozen bits input to the polar coder 205 may be decided appropriately (e.g., using density evolution to pick the frozen bits). In some aspects, the magnitude ordering of $\varepsilon_1$ and $\varepsilon_2$ may not be critical (e.g., if the value for $\varepsilon_1$ and $\varepsilon_2$ were switched, the resulting component BEC $W_i$: $U_i \rightarrow (Y_N, U^{i-1})$ would still be the same).

Figure 3A:
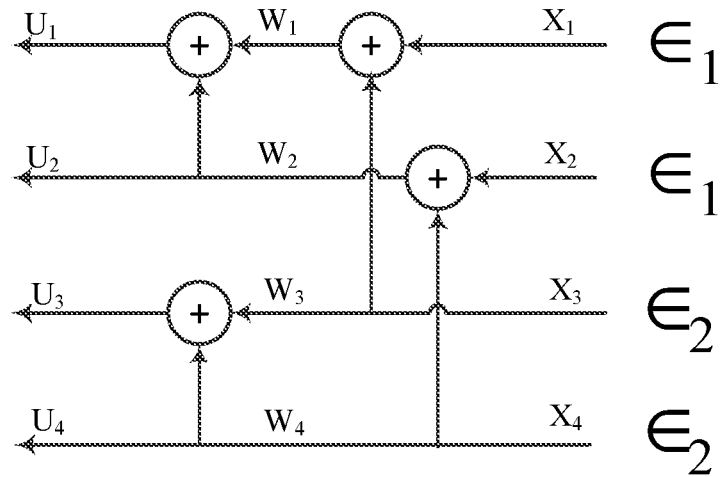
FIGS. 3A and 3B illustrate examples of interleaving and modulation schemes that support polar codes and modulation mappings in accordance with aspects of the present disclosure.
Figure 3A:
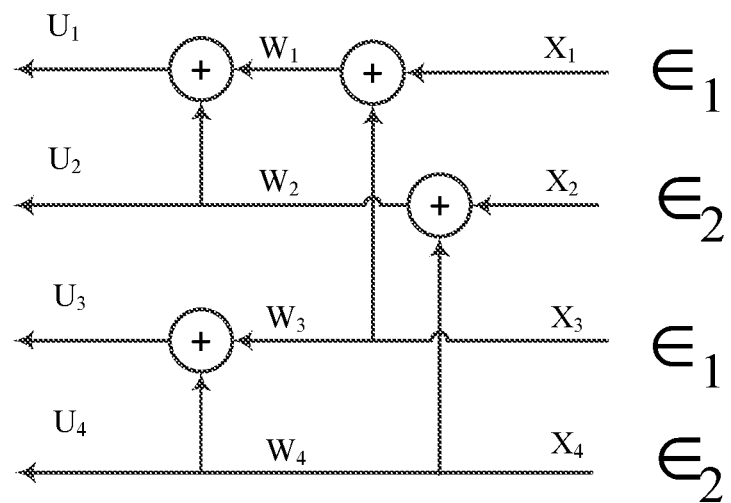
Figure 3B:
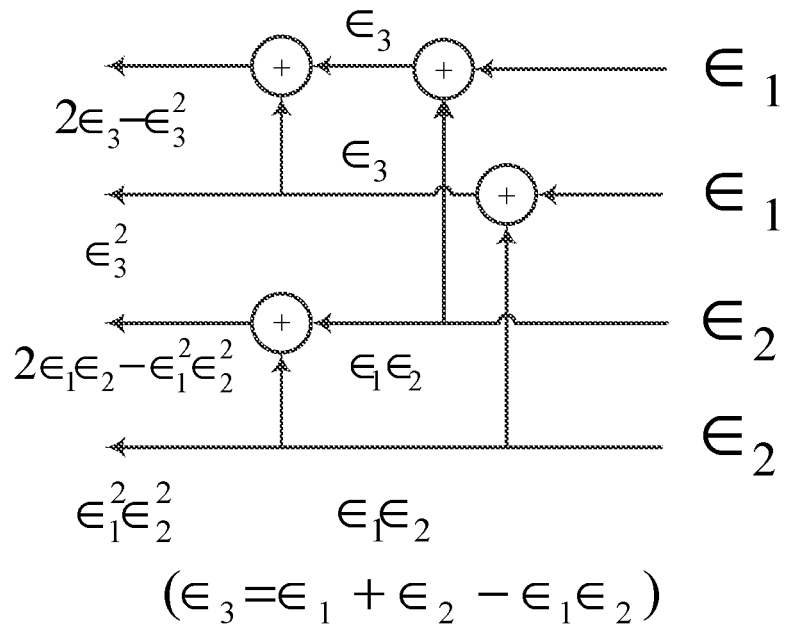
Figure 3B:
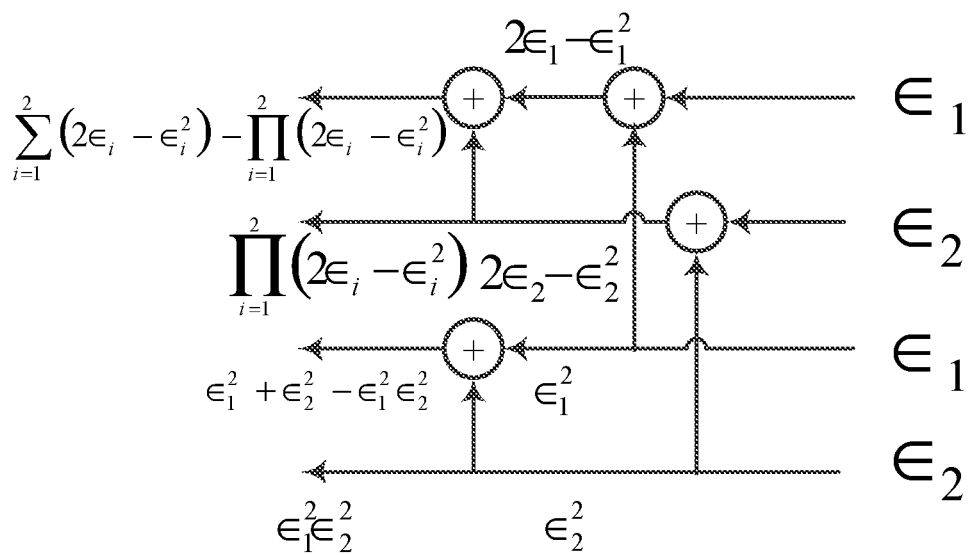

FIGS. 3A and 3B illustrate examples of an interleaving and modulation schemes 300 that support polar codes and modulation mappings. In some cases, schemes 300 may represent aspects of techniques performed by a transmitting device, such as a UE 115 or base station 105 as described with reference to FIG. 1. In some cases, aspects of schemes 300 may be implemented using a transmitter, a transceiver, or a sub-component of a transmitter or transceiver. Schemes 300 may include a scheme 1 and a scheme 2. Schemes 300 are illustrated from the decoder perspective used at a receiver and may be used to decode the transmitted bits.

Schemes 300 illustrate an example of polar code of length N=4, although the described techniques may apply to any value of N. Moreover, and for the sake of simplicity, it may be assumed that the component channel under consideration is an erasure channel, although the described techniques may be applied to any channel model. It may also be assumed that there are 2 sub-channels with erasure probabilities of $\varepsilon_1$ and $\varepsilon_2$. A difference between scheme 1 and scheme 2 may include scheme 1 using an interleaver between the polar coder and the modulation mapper. Scheme 1 may be more desirable than scheme 2 because scheme 1 groups encoded bits/component channels of similar polarization together. This may provide for improved performance by increasing overall polarization.

As illustrated in FIG. 3B, applying the principle of single parity check (SPC) and repetition (REP) decoding for polar codes, final erasure probabilities, $\varepsilon$, may be derived for a number of bits (e.g., $U_1, \ldots, U_4$), where $\varepsilon_3 = \varepsilon_1 + \varepsilon_2 - \varepsilon_1 \varepsilon_2$. As the derivations of FIG. 3B show, $U_1$ and $U_4$ may have a same erasure probability for scheme 1 and scheme 2. However, $U_2$ and $U_3$ are more polarized for scheme 1 than for scheme 2.

As one non-limiting example, using values of 0.7 for $\varepsilon_1$ and 0.3 for $\varepsilon_2$ in scheme 1 and scheme 2 and using the derivations shown in FIG. 3B, $U_1$ calculates to 0.9559 and $U_4$ calculates to 0.0441 for schemes 1 and 2. $U_2$ calculates to 0.6241 for scheme 1 and $U_2$ calculates to 0.4641 for scheme 2. Also, $U_3$ calculates to 0.3759 for scheme 1 and $U_3$ calculates to 0.5359 for scheme 2. This results in scheme 1 having more polarization than scheme 2.

Figure 4:
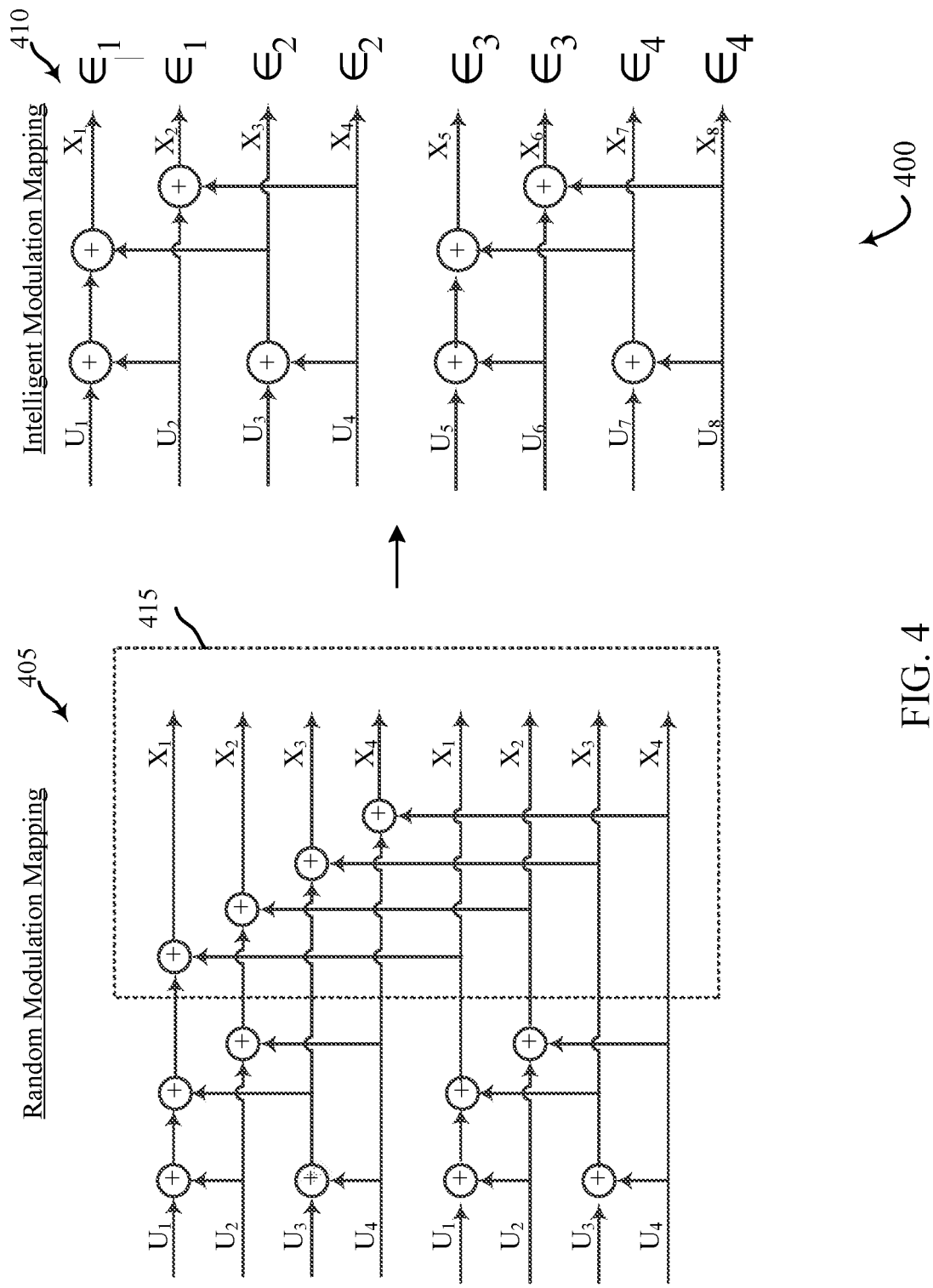
FIG. 4 illustrates an example of interleaving and modulation schemes that support polar codes and modulation mappings in accordance with aspects of the present disclosure.

FIG. 4 illustrates an example of interleaving and modulation schemes 400 that support polar codes and modulation mappings. In some cases, schemes 400 may represent aspects of techniques performed by a transmitting device, such as techniques performed by a UE 115 or base station 105 as described with reference to FIG. 1. In some cases, aspects of schemes 400 may be implemented using a transmitter, a transceiver, or a sub-component of a transmitter or transceiver. Schemes 400 may include a random modulation mapping scheme 405 and an intelligent modulation mapping scheme 410. Schemes 400 illustrate aspects of modulation mapping for $2^{2[<]BEGINITALmk}$-QAM.

Schemes 400 may leverage $$G_{2\times 2} = \begin{bmatrix} 1 & 0 \\ 1 & 1 \end{bmatrix},$$

which may result in simpler decoding. 16-QAM may be a special case of this scheme (where k=2). Aspects of the interleaving and modulation mapping process as described with reference to FIGS. 2, 3A, and 3B may be leveraged according to schemes 400.

In an example, k=3 may indicate 256-QAM is being used. 256-QAM may be independently mapped on I, Q and composed of 4 different types of bits in terms of reliabilities, which may include two independent 16-pulse amplitude modulations (16-PAMs) on I, Q dimension composed of 4 bits each. It may be assumed that $\varepsilon_1$, $\varepsilon_2$, $\varepsilon_3$, and $\varepsilon_4$ represent the reliabilities of the 4 different types of bits. There are two possibilities for mapping from polar coded bits to modulation mapping. A first possibility is random modulation mapping scheme 405, which may have deficiencies in polarization. A second possibility is intelligent modulation mapping scheme 410 in accordance with the presently described techniques.

On the receiver side, a joint multi-stage decoding receiver (over coding and modulation) may obtain improved performance. A 1-shot demodulation followed by polar decoder may be suboptimal in some non-Gray cases.

In some aspects, intelligent modulation mapping scheme 410 may leverage polarization in the modulation, and eliminate multi-levels of the polar code. The original polar code construction of random modulation mapping scheme 405 may be modified by removing the last stage (identified as stage 415) and instead utilizing intelligent modulation mapping scheme 410. This modification may result in two component polar codes of half-length.

Mapping according to intelligent modulation mapping scheme 410 (where $\varepsilon_1 \geq \varepsilon_2 \geq \varepsilon_3 \geq \varepsilon_4$) may result in improved polarization. For every mapping, different values of $\varepsilon_1$, $\varepsilon_2$, $\varepsilon_3$, and $\varepsilon_4$ can be obtained and, for each mapping, interleaving of $\varepsilon_1$, $\varepsilon_2$, $\varepsilon_3$, and $\varepsilon_4$ to polar coded bits may be determined through simulations. The interleaver may not be expected to change with a signal to noise ratio (SNR) as $\varepsilon_i$ may be monotonic with SNR. Density evolution may be used to obtain frozen bits based on a code-rate to be supported.

Modulation mapping for 256-QAM may use a joint successive cancelation (SC or SC-List) decoding with demodulation. For Gray mapping, a 1-shot demodulator may be used. Some advantages of the 1-shot demodulator may include a multi-level coding architecture, yet joint SC (SC-L) decoding may be used within the realms of polar decoding. Effectively, the code is of length-N, while component codes are of length N/2. Performance may align with a length-N polar code as joint decoding may be used. The same procedure may be extended to $2^{[<]BEGINITALmk}$-QAM where k>3.

Figure 5:
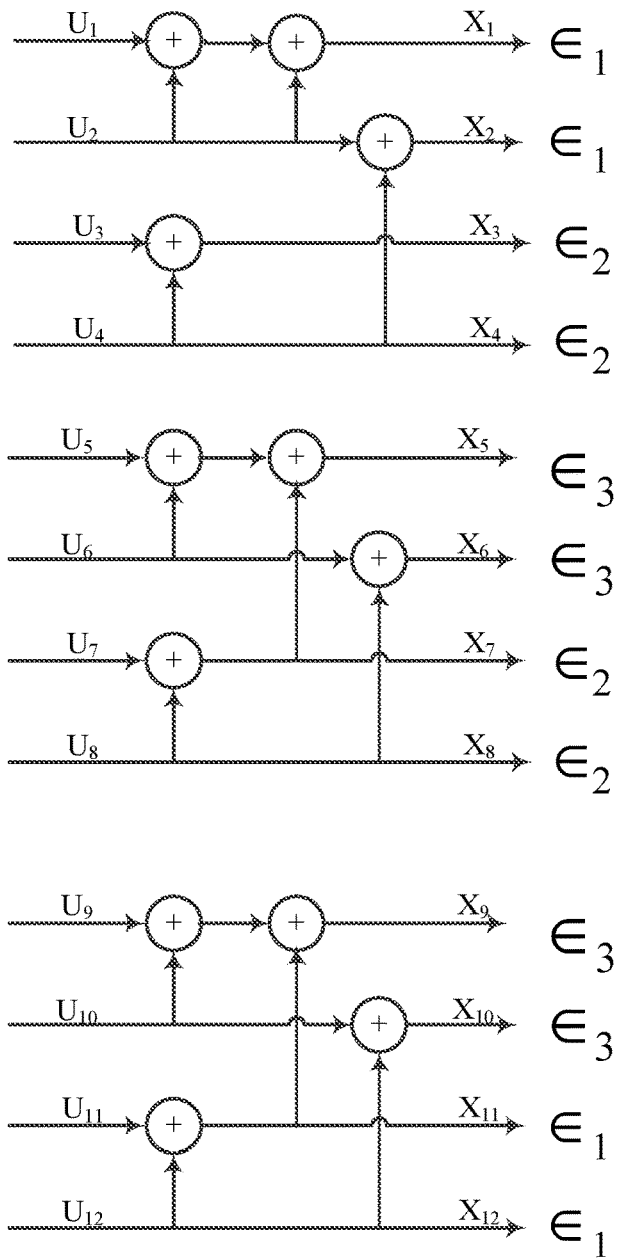
FIG. 5 illustrates an example of an interleaving and modulation scheme that supports polar codes and modulation mappings in accordance with aspects of the present disclosure.
Figure 5:
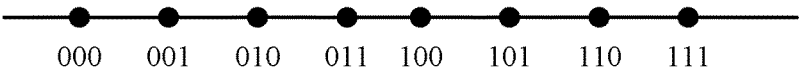

FIG. 5 illustrates an example of an interleaving and modulation scheme 500 that supports polar codes and modulation mappings. In some cases, scheme 500 may represent aspects of techniques performed by a transmitting device, such as techniques performed by a UE 115 or base station 105 as described with reference to FIG. 1. Scheme 500 illustrate aspects of modulation mapping for 64-QAM.

64-QAM with independent I, Q mappings may consist of three types of component channels (e.g., 3 distinct reliabilities). Assume $\varepsilon_1$, $\varepsilon_2$, and $\varepsilon_3$ are the reliabilities of the 3 component channels. Following the techniques of $2^{2[<]}$ BEGINITALmk-QAM and 16-QAM, adjacent mapping of the reliabilities results in increased polarization. Each pair of component channels may receive a sub-polar code. In some aspects, scheme 500 will polarize the reliabilities further rather than assigning each component channel to each component polar code, given $\varepsilon_1$, $\varepsilon_2$, and $\varepsilon_3$ are different. The frozen bits may be obtained using density evolution, for example. On the receiver side, joint decoding may be performed if necessary (e.g., for non-Gray mappings). There may be three component channels that correspond to $\varepsilon_1$, $\varepsilon_2$, and $\varepsilon_3$. A different mapping (e.g., other than Gray mapped 8-PAM (I of 64-QAM)) may result in different values for $\varepsilon_1$, $\varepsilon_2$, and $\varepsilon_3$.

Figure 6:
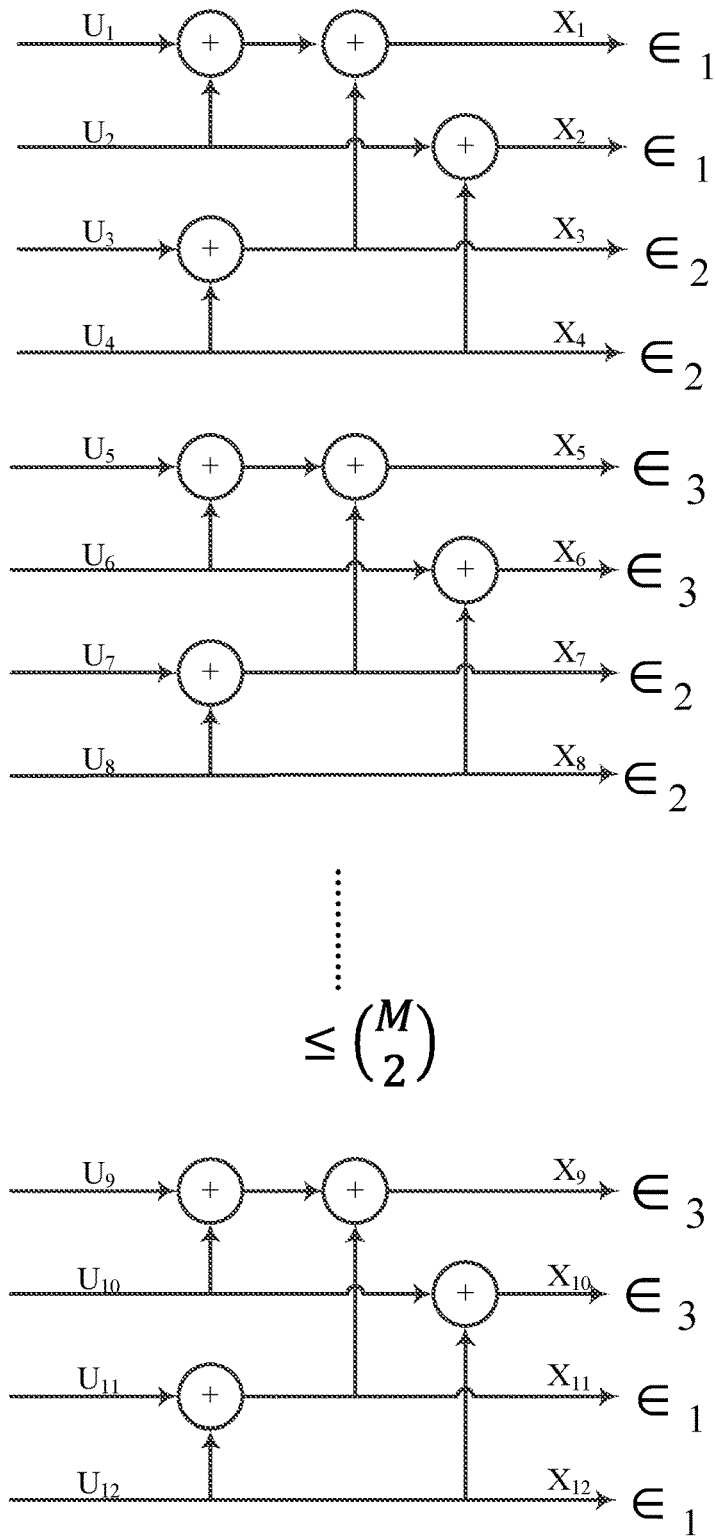
FIG. 6 illustrates an example of an interleaving and modulation scheme that supports polar codes and modulation mappings in accordance with aspects of the present disclosure.

FIG. 6 illustrates an example of an interleaving and modulation scheme 600 that supports polar codes and modulation mappings. In some cases, scheme 600 may represent aspects of techniques performed by a transmitting device, such as techniques performed by a UE 115 or base station 105 as described with reference to FIG. 1. In some cases, aspects of scheme 600 may be implemented using a transmitter, a transceiver, or a sub-component of a transmitter or transceiver. In some cases, aspects of scheme 600 may be implemented using coding and mapping component 715, coding and mapping component 815, and coding and mapping component 915 as described with reference to FIGS. 7, 8, and 9, respectively. Scheme 600 illustrate aspects of modulation mapping for $2^{M*2}$-QAM (e.g., 1024-QAM, 4096-QAM, etc.).

$2^{M*2}$-QAM with independent I, Q mappings may include M types of component channels (M distinct reliabilities). For instance, $\varepsilon_1$, $\varepsilon_2$, $\varepsilon_3$, ..., $\varepsilon_M$ are the reliabilities of the M component channels, and each pair of component channels may receive a sub-polar code. Scheme 500 may polarize the reliabilities further rather than assigning each component channel to each component polar code given that $\varepsilon_1$, $\varepsilon_2$, $\varepsilon_3$ ..., $\varepsilon_M$ are different. As an example, $$\binom{M}{2}$$

component codes may be used. In some cases, fewer component codes may be used (e.g., at least M), but may be optimized to determine which are the best pairings (e.g., the pairings that result in the greatest polarization). The frozen bits may be obtained using density evolution, for example. On the receiver side, joint decoding can be performed, if necessary (e.g., for non-Gray mappings).

Figure 7:
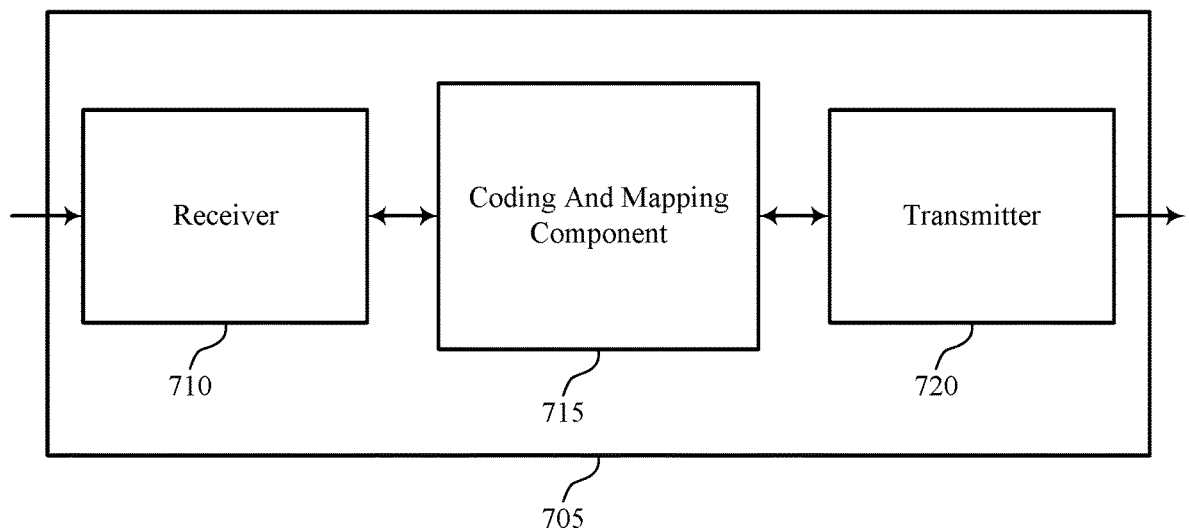
FIGS. 7 through 9 show block diagrams of a device that supports polar codes and modulation mappings in accordance with aspects of the present disclosure.

FIG. 7 shows a block diagram 700 of a device 705 that supports polar codes and modulation mappings in accordance with various aspects of the present disclosure. Device 705 may be an example of aspects of a UE 115 or base station 105 as described with reference to FIGS. 1 and 2. Device 705 may include receiver 710, coding and mapping component 715, and transmitter 720. Device 705 may also include a processor. Each of these components may be in communication with one another (e.g., via one or more buses).

Receiver 710 may receive information such as packets, user data, or control information associated with various information channels (e.g., control channels, data channels, and information related to polar codes and modulation mappings, etc.). Information may be passed on to other components of the device. The receiver 710 may be an example of aspects of the transceiver 1040 described with reference to FIG. 10.

Coding and mapping component 715 may be an example of aspects of a UE coding and mapping component 1015 or a base station coding and mapping component 1115 described with reference to FIGS. 10 and 11. In some examples, coding and mapping component 715 may be a component of a transmitter, such as transmitter 720. Coding and mapping component 715 may perform polar coding to encode a set of bits, the polar coding associated with a set of component channels which may be associated with a polar code length. In some examples, coding and mapping component 715 may interleave the encoded bits; map the interleaved encoded bits to a modulation symbol, where the interleaving and the mapping of each encoded bit are based on an asymmetry of a polar code construction; and transmit the interleaved encoded bits based on the mapping.

Transmitter 720 may transmit signals generated by other components of device 705. In some examples, the transmitter 720 may be collocated with a receiver 710 in a transceiver module. For example, the transmitter 720 may be an example of aspects of the transceiver 1040 described with reference to FIG. 10. The transmitter 720 may include a single antenna, or it may include a set of antennas.

Figure 8:
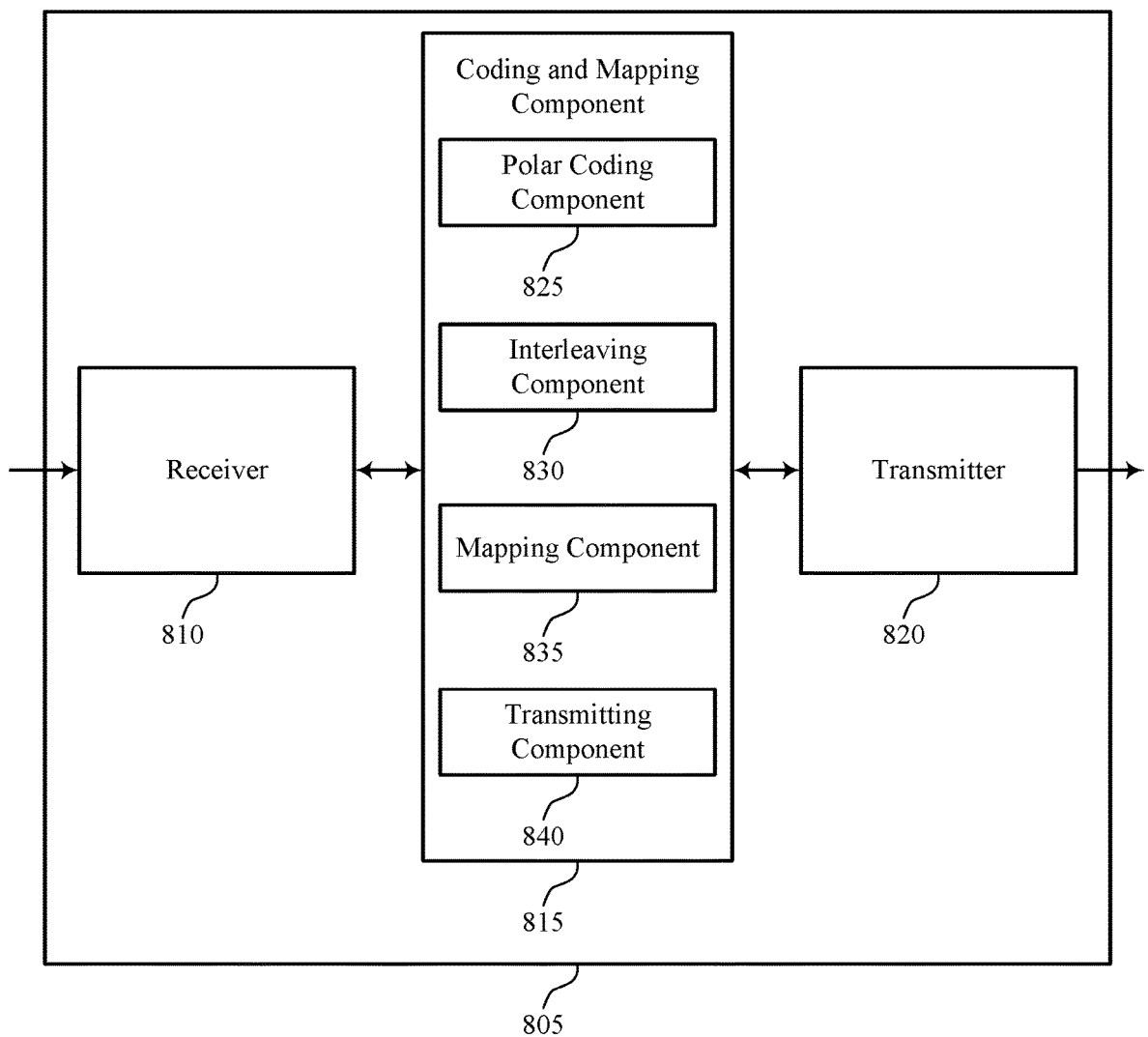

FIG. 8 shows a block diagram 800 of a device 805 that supports polar codes and modulation mappings in accordance with various aspects of the present disclosure. Device 805 may be an example of aspects of a device 705 or a UE 115 or base station 105 as described with reference to FIGS. 1, 2 and 7. Device 805 may include receiver 810, coding and mapping component 815, and transmitter 820. Device 805 may also include a processor. Each of these components may be in communication with one another (e.g., via one or more buses).

Receiver 810 may receive information such as packets, user data, or control information associated with various information channels (e.g., control channels, data channels, and information related to polar codes and modulation mappings, etc.). Information may be passed on to other components of device 805. The receiver 810 may be an example of aspects of the transceiver 1040 described with reference to FIG. 10.

Coding and mapping component 815 may be an example of aspects of a UE coding and mapping component 1015 or a base station coding and mapping component 1115 described with reference to FIGS. 10 and 11. In some examples, coding and mapping component 815 may be a component of a transmitter, such as transmitter 820. Coding and mapping component 815 may also include polar coding component 825, interleaving component 830, mapping component 835, and transmitting component 840.

Polar coding component 825 may perform polar coding to encode a set of bits, the polar coding associated with a set of component channels associated with a polar code length. In some cases, performing polar coding includes using a set of redundant polar coders to concurrently encode the set of bits, where each polar coder is associated with a different group of bits from the set of bits. In these cases, the set of polar coders is redundant because each of the polar coders uses the same polar coding scheme. Different groups of bits may be encoded simultaneously by different redundant polar coders.

Interleaving component 830 may interleave the encoded bits. In some cases, the interleaving includes grouping the encoded bits serially according to the asymmetry of the polar code construction. Mapping component 835 may map the interleaved encoded bits to a modulation symbol, where the interleaving and the mapping of each encoded bit are based on an asymmetry of a polar code construction. In some cases, the mapping is configured to polarize a reliability of each of the component channels. In some cases, the mapping is different for different modulation schemes.

Transmitting component 840 may transmit the interleaved encoded bits based on the mapping. For example, transmitting component 840 may be a component of the transmitter 820. Transmitter 820 may transmit signals generated by other components of the device. In some examples, the transmitter 820 may be collocated with a receiver 810 in a transceiver module. For example, the transmitter 820 may be an example of aspects of the transceiver 1040 described with reference to FIG. 10. The transmitter 820 may include a single antenna, or it may include a set of antennas.

Figure 9:
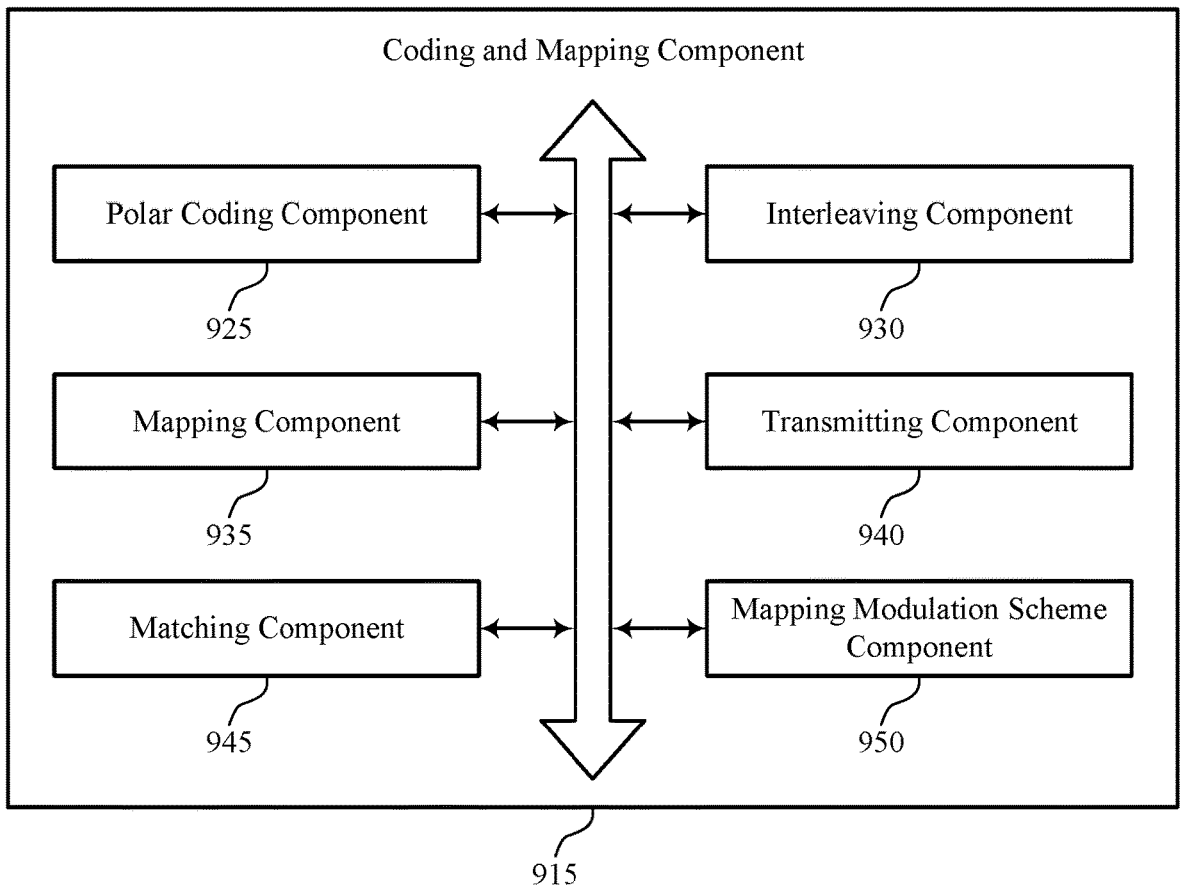

FIG. 9 shows a block diagram 900 of a coding and mapping component 915 that supports polar codes and modulation mappings in accordance with various aspects of the present disclosure. The coding and mapping component 915 may be an example of aspects of a coding and mapping component 715, a coding and mapping component 815, a UE coding and mapping component 1015, or a base station coding and mapping component 1115 described with reference to FIGS. 7, 8, 10, and 11. The coding and mapping component 915 may include polar coding component 925, interleaving component 930, mapping component 935, and transmitting component 940. Each of these modules may communicate, directly or indirectly, with one another (e.g., via one or more buses).

Polar coding component 925 may perform polar coding to encode a set of bits, the polar coding associated with a set of component channels associated with a polar code length. In some cases, performing polar coding includes using a set of redundant polar coders to concurrently encode the set of bits, where each polar coder is associated with a different group of bits from the set of bits.

Interleaving component 930 may interleave the encoded bits. In some cases, the interleaving includes grouping the encoded bits serially according to the asymmetry of the polar code construction. Mapping component 935 may map the interleaved encoded bits to a modulation symbol, where the interleaving and the mapping of each encoded bit are based on an asymmetry of a polar code construction. In some cases, the mapping is configured to polarize a reliability of each of the component channels. In some cases, the mapping is different for different modulation schemes.

Transmitting component 940 may transmit the interleaved encoded bits based on the mapping. Matching component 945 may match a second set of encoded bits associated with a second channel reliability to a second portion of the modulation symbol. In some cases, the interleaving includes matching a first set of encoded bits associated with a first channel reliability to a first portion of a modulation symbol.

Mapping modulation scheme component 950 may implement a mapping for a modulation scheme. In some cases, the mapping includes using at least one of an anti-Gray mapping or a Gray mapping for a QPSK modulation scheme. In some cases, the mapping includes using at least one of a natural binary mapping or a Gray mapping for a 16-QAM modulation scheme. Additionally or alternatively, the mapping may include using a Gray mapping or a random mapping for a $2^{2*M}$-QAM modulation scheme.

Figure 10:
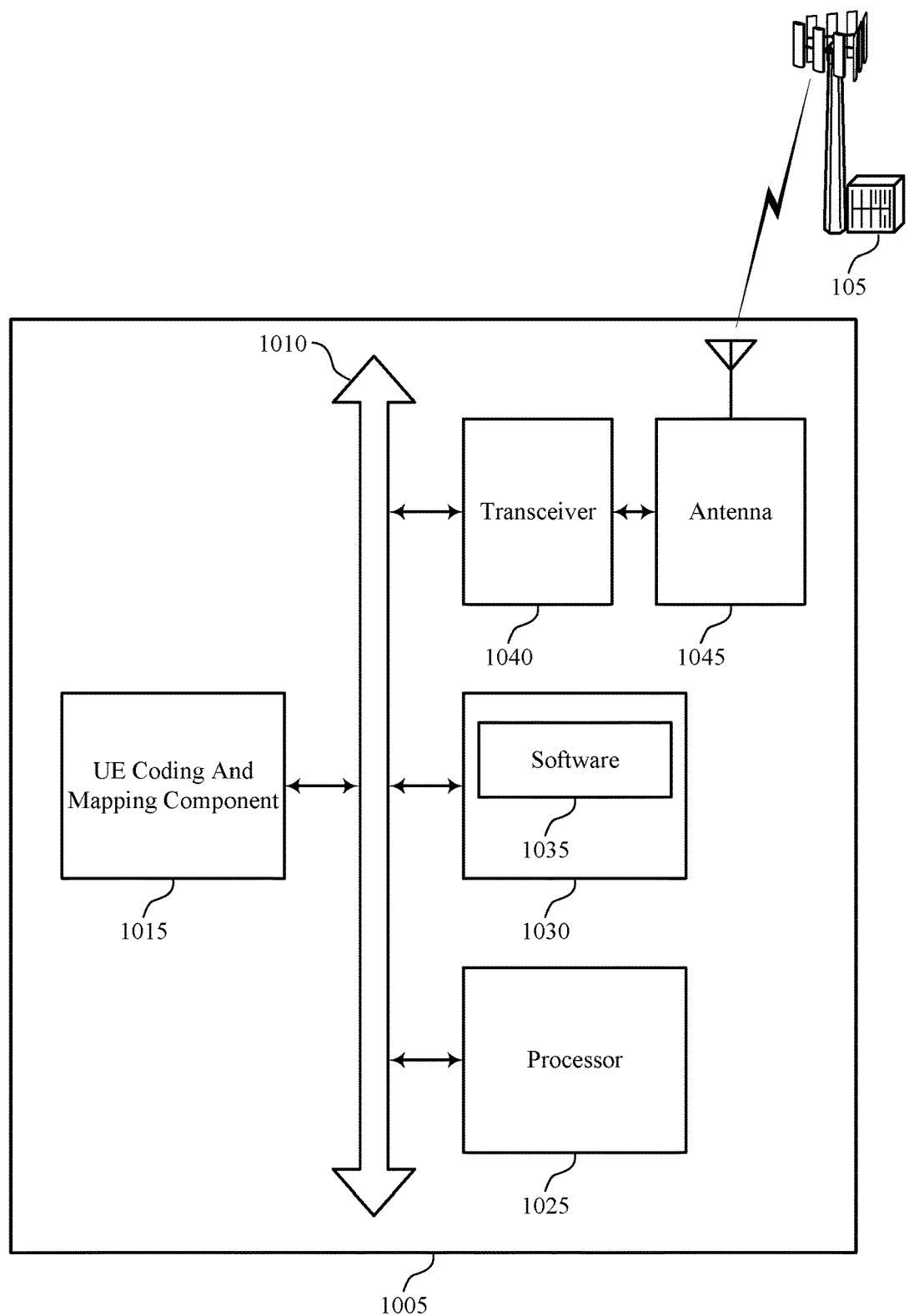
FIG. 10 illustrates a block diagram of a system including a device that supports polar codes and modulation mappings in accordance with aspects of the present disclosure.

FIG. 10 shows a diagram of a system 1000 including a device 1005 that supports polar codes and modulation mappings in accordance with various aspects of the present disclosure. Device 1005 may be an example of a device 705, device 805, or a UE 115 as described above with reference to FIGS. 1, 2,7 and 8.

Device 1005 may include components for bi-directional voice and data communications including components for transmitting and receiving communications, including UE coding and mapping component 1015, processor 1025, memory 1030, software 1035, transceiver 1040, and antenna 1045. Processor 1025 may include an intelligent hardware device, (e.g., a central processing unit (CPU), a microcontroller, an application specific integrated circuit (ASIC), etc.).

Memory 1030 may include random access memory (RAM) and read only memory (ROM). The memory 1030 may store computer-readable, computer-executable software 1035 including instructions that, when executed, cause the processor to perform various functions described herein. In some cases, the memory 1030 can contain, among other things, a Basic Input-Output system (BIOS) which may control basic hardware and/or software operation such as the interaction with peripheral components or devices.

Software 1035 may include code to implement aspects of the present disclosure, including code to support polar codes and modulation mappings. Software 1035 can be stored in a non-transitory computer-readable medium such as system memory or other memory. In some cases, the software 1035 may not be directly executable by the processor but may cause a computer (e.g., when compiled and executed) to perform functions described herein.

Transceiver 1040 may communicate bi-directionally, via one or more antennas, wired, or wireless links as described above. For example, the transceiver 1040 may represent a wireless transceiver and may communicate bi-directionally with another wireless transceiver. The transceiver 1040 may also include a modem to modulate the packets and provide the modulated packets to the antennas for transmission, and to demodulate packets received from the antennas. In some cases, device 1005 may include a single antenna 1045. However, in some cases, device 1005 may have more than one antenna 1045, which may be capable of concurrently transmitting or receiving multiple wireless transmissions.

Figure 11:
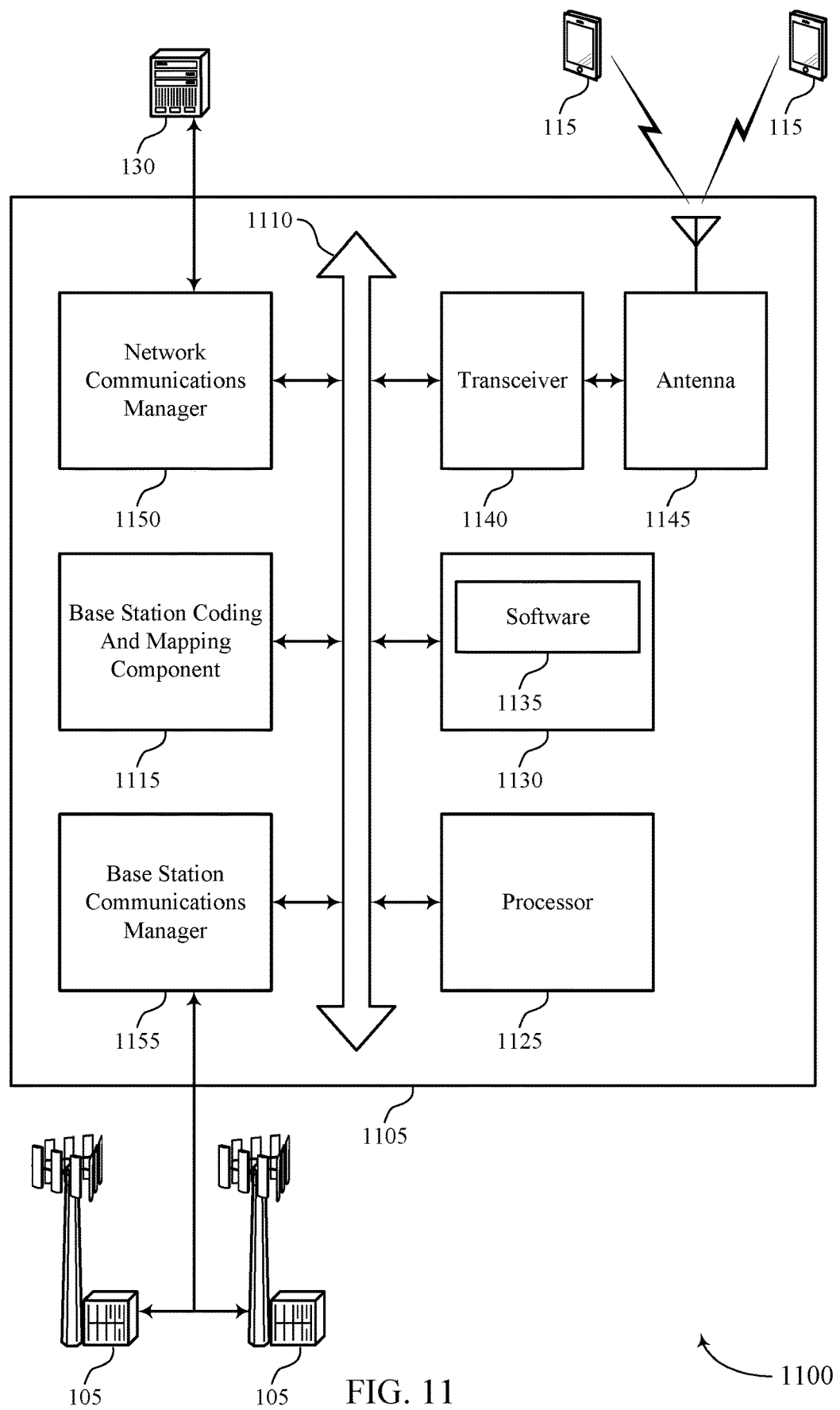
FIG. 11 illustrates a block diagram of a system including a base station that supports polar codes and modulation mappings in accordance with aspects of the present disclosure.

FIG. 11 shows a diagram of a system 1100 including a device 1105 that supports polar codes and modulation mappings in accordance with various aspects of the present disclosure. Device 1105 may be an example of a device 805, device 905, or a base station 105 as described above with reference to FIGS. 1, 2, 8, and 9.

Device 1105 may include components for bi-directional voice and data communications including components for transmitting and receiving communications, including base station coding and mapping component 1115, processor 1125, memory 1130, software 1135, transceiver 1140, antenna 1145, network communications manager 1150, and base station communications component 1155.

Processor 1125 may include an intelligent hardware device, (e.g., a CPU, a microcontroller, an ASIC, etc.). Memory 1130 may include RAM and ROM. The memory 1130 may store computer-readable, computer-executable software 1135 including instructions that, when executed, cause the processor to perform various functions described herein. In some cases, memory 1130 can contain, among other things, a BIOS which may control basic hardware and/or software operation such as the interaction with peripheral components or devices.

Software 1135 may include code to implement aspects of the present disclosure, including code to support polar codes and modulation mappings. Software 1135 can be stored in a non-transitory computer-readable medium such as system memory or other memory. In some cases, software 1135 may not be directly executable by the processor but may cause a computer (e.g., when compiled and executed) to perform functions described herein.

Transceiver 1140 may communicate bi-directionally, via one or more antennas, wired, or wireless links as described above. For example, transceiver 1140 may represent a wireless transceiver and may communicate bi-directionally with another wireless transceiver. Transceiver 1140 may also include a modem to modulate the packets and provide the modulated packets to the antennas for transmission, and to demodulate packets received from the antennas.

In some cases, device 1105 may include a single antenna 1145. However, in some cases, device 1105 may have more than one antenna 1145, which may be capable of concurrently transmitting or receiving multiple wireless transmissions. Network communications manager 1150 may manage communications with the core network (e.g., via one or more wired backhaul links). For example, the network communications component 1150 may manage the transfer of data communications for client devices, such as one or more UEs 115.

Base station communications component 1155 may manage communications with other base stations 105, and may include a controller or scheduler for controlling communications with UEs 115 in cooperation with other base stations 105. For example, the base station communications component 1155 may coordinate scheduling for transmissions to UEs 115 for various interference mitigation techniques such as beamforming or joint transmission. In some examples, base station communications component 1155 may provide an X2 interface within an LTE/LTE-A wireless communication network technology to provide communication between base stations 105.

Figure 12:
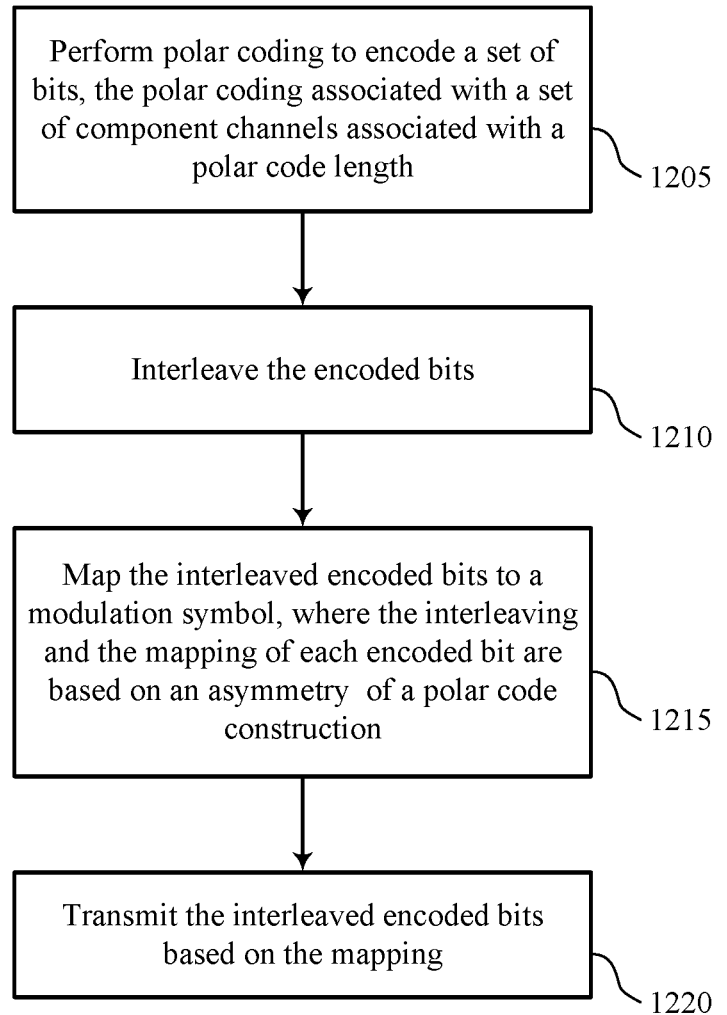
FIGS. 12 through 13 illustrate methods for polar codes and modulation mappings in accordance with aspects of the present disclosure.

FIG. 12 shows a flowchart illustrating a method 1200 for polar codes and modulation mappings in accordance with various aspects of the present disclosure. The operations of method 1200 may be implemented by a UE 115 or base station 105 or its components as described herein. For example, the operations of method 1200 may be performed by a coding and mapping component 715, a coding and mapping component 815, or a coding and mapping component 915, as described with reference to FIGS. 7 through 9. In some examples, a UE 115 or base station 105 may execute a set of codes to control the functional elements of a device to perform the functions described below. Additionally or alternatively, the UE 115 or base station 105 may perform aspects of the functions described below using special-purpose hardware.

At block 1205, the UE 115 or base station 105 may perform polar coding to encode a set of bits, the polar coding associated with a set of component channels associated with a polar code length. The operations of block 1205 may be performed according to the methods described with reference to FIGS. 2 through 6. In some examples, aspects of the operations of block 1205 may be performed by a polar coding component 825 or a polar coding component 925 as described with reference to FIGS. 8 and 9.

At block 1210, the UE 115 or base station 105 may interleave the encoded bits. The operations of block 1210 may be performed according to the methods described with reference to FIGS. 2 through 6. In some examples, aspects of the operations of block 1210 may be performed by an interleaving component 830 or an interleaving component 930 as described with reference to FIGS. 8 and 9.

At block 1215, the UE 115 or base station 105 may map the interleaved encoded bits to a modulation symbol, where the interleaving and the mapping of each encoded bit are based on an asymmetry of a polar code construction. The operations of block 1215 may be performed according to the methods described with reference to FIGS. 2 through 6. In some examples, aspects of the operations of block 1215 may be performed by a mapping component 835 or a mapping component 935 as described with reference to FIGS. 8 and 9.

At block 1220, the UE 115 or base station 105 may transmit the interleaved encoded bits based on the mapping. The operations of block 1220 may be performed according to the methods described with reference to FIGS. 2 through 6. In some examples, aspects of the operations of block 1220 may be performed by a transmitting component 840 or a transmitting component 940 as described with reference to FIGS. 8 and 9.

Figure 13:
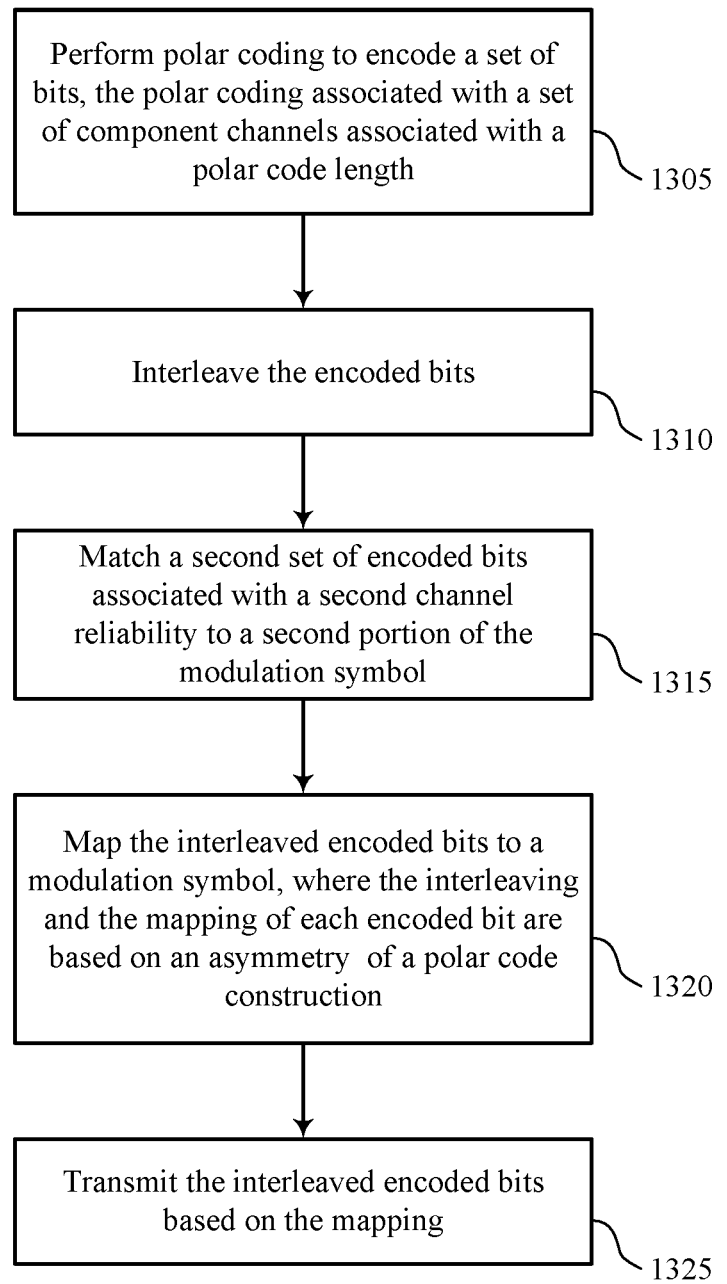

FIG. 13 shows a flowchart illustrating a method 1300 for polar codes and modulation mappings in accordance with various aspects of the present disclosure. The operations of method 1300 may be implemented by a UE 115 or base station 105 or its components as described herein. For example, the operations of method 1300 may be performed by a coding and mapping component as described with reference to FIGS. 7 through 9. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1305, the UE 115 or base station 105 may perform polar coding to encode a set of bits, the polar coding associated with a set of component channels associated with a polar code length. The operations of block 1305 may be performed according to the methods described with reference to FIGS. 2 through 6. In some examples, aspects of the operations of block 1305 may be performed by a polar coding component 825 or a polar coding component 925 as described with reference to FIGS. 8 and 9.

At block 1310, the UE 115 or base station 105 may interleave the encoded bits. The operations of block 1310 may be performed according to the methods described with reference to FIGS. 2 through 6. In some examples, aspects of the operations of block 1310 may be performed by an interleaving component 830 or an interleaving component 930 as described with reference to FIGS. 8 and 9.

At block 1315, the UE 115 or base station 105 may match a second set of encoded bits associated with a second channel reliability to a second portion of the modulation symbol. The operations of block 1315 may be performed according to the methods described with reference to FIGS. 2 through 6. In some examples, aspects of the operations of block 1315 may be performed by a matching component 945 as described with reference to FIG. 9.

At block 1320, the UE 115 or base station 105 may map the interleaved encoded bits to a modulation symbol, where the interleaving and the mapping of each encoded bit are based on an asymmetry of a polar code construction. The operations of block 1320 may be performed according to the methods described with reference to FIGS. 2 through 6. In some examples, aspects of the operations of block 1320 may be performed by a mapping component 835 or a mapping component 935 as described with reference to FIGS. 8 and 9.

At block 1325, the UE 115 or base station 105 may transmit the interleaved encoded bits based on the mapping. The operations of block 1325 may be performed according to the methods described with reference to FIGS. 2 through 6. In some examples, aspects of the operations of block 1325 may be performed by a transmitting component 840 or a transmitting component 940 as described with reference to FIGS. 8 and 9.

In some examples, aspects from two or more of the methods 1200 or 1300 described with reference to FIG. 12 or 13 may be combined. It should be noted that the methods 1200 and 1300 are just example implementations, and that the operations of methods 1200 and 1300 may be rearranged or otherwise modified and that other implementations are possible.

Techniques described herein may be used for various wireless communications systems such as CDMA, TDMA, FDMA, OFDMA, single carrier frequency division multiple access (SC-FDMA), and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM, etc. UTRA and E-UTRA are part of Universal Mobile Telecommunications system (UMTS). 3GPP Long Term Evolution (LTE) and LTE-Advanced (LTE-A) are new releases of Universal Mobile Telecommunications System (UMTS) that use E-UTRA. UTRA, E-UTRA, UMTS, LTE, LTE-A, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects an LTE system may be described for purposes of example, and LTE terminology may be used in much of the description, the techniques described herein are applicable beyond LTE applications.

In LTE/LTE-A networks, including such networks described herein, the term evolved node B (eNB) may be generally used to describe the base stations. The wireless communications system or systems described herein may include a heterogeneous LTE/LTE-A network in which different types of eNBs provide coverage for various geographical regions. For example, each eNB or base station may provide communication coverage for a macro cell, a small cell, or other types of cell. The term "cell" is a 3GPP term that can be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers). A UE may be able to communicate with various types of base stations and network equipment including macro eNBs, small cell eNBs, relay base stations, and the like.

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, communication links of wireless communications system 100 as described with reference to FIG. 1—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates an inclusive list such that, for example, a phrase referring to "at least one of" a list of items refers to any combination of those items, including single members. As an example, "at least one of: A, B, or C" is intended to cover A, B, C, A-B, A-C, B-C, and A-B-C, as well as any combination with multiples of the same element (e.g., A-A, A-A-A, A-A-B, A-A-C, A-B-B, A-C-C, B-B, B-B-B, B-B-C, C-C, and C-C-C or any other ordering of A, B, and C).

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
performing polar coding to encode a plurality of bits, the polar coding associated with a plurality of component channels associated with a polar code length, wherein the plurality of component channels correspond to two or more pairs of encoded bits, each pair of encoded bits having a same erasure probability, and wherein a quantity of the component channels is based at least in part on the polar code length, and wherein the polar coding is based at least in part on an asymmetry of a generating matrix for encoding the plurality of bits;
interleaving the encoded bits, wherein the interleaving comprises reordering the encoded bits based at least in part on the asymmetry of the generating matrix and an ordering of a reliability of each component channel of the plurality of component channels resulting from the asymmetry of the generating matrix;
mapping the interleaved encoded bits to a modulation symbol, wherein the mapping of each encoded bit is based at least in part on the asymmetry of the generating matrix, and wherein the mapping is configured to polarize the reliability of each component channel of the plurality of component channels; and
transmitting the interleaved encoded bits based at least in part on the mapping.

2. The method of claim 1, wherein the interleaving comprises:
grouping the encoded bits serially according to the asymmetry of the generating matrix.

3. The method of claim 1, wherein the mapping is different for different modulation schemes.

4. The method of claim 1, wherein the interleaving comprises:
matching a first set of encoded bits associated with a first channel reliability to a first portion of the modulation symbol; and
matching a second set of encoded bits associated with a second channel reliability to a second portion of the modulation symbol.

5. The method of claim 1, wherein the mapping comprises:
using at least one of an anti-Gray mapping or a Gray mapping for a quadrature phase shift keying (QPSK) modulation scheme.

6. The method of claim 1, wherein the mapping comprises:
using at least one of a natural binary mapping, or a random mapping, or a Gray mapping for a 16 quadrature amplitude modulation (16-QAM) modulation scheme.

7. The method of claim 1, wherein the mapping comprises:
using a Gray mapping or a random mapping for a $2^{2M}$ quadrature amplitude modulation ($2^{2M}$-QAM) modulation scheme.

8. The method of claim 1, wherein performing polar coding comprises:
using a plurality of redundant polar coders to concurrently encode the plurality of bits, wherein each polar coder is associated with a different group of bits from the plurality of bits.

9. The method of claim 1, wherein each pair of encoded bits is grouped based at least in part on the same erasure probability.

10. An apparatus for wireless communication, comprising:
means for performing polar coding to encode a plurality of bits, the polar coding associated with a plurality of component channels associated with a polar code length, wherein the plurality of component channels correspond to two or more pairs of encoded bits, each pair of encoded bits having a same erasure probability, and wherein a quantity of the component channels is based at least in part on the polar code length, and wherein the polar coding is based at least in part on an asymmetry of a generating matrix for encoding the plurality of bits;
means for interleaving the encoded bits, wherein the interleaving comprises reordering the encoded bits based at least in part on the asymmetry of the generating matrix and an ordering of a reliability of each component channel of the plurality of component channels resulting from the asymmetry of the generating matrix;
means for mapping the interleaved encoded bits to a modulation symbol, wherein the mapping of each encoded bit is based at least in part on the asymmetry of the generating matrix, and wherein the mapping is configured to polarize the reliability of each component channel of the plurality of component channels; and
means for transmitting the interleaved encoded bits based at least in part on the mapping.

11. The apparatus of claim 10, wherein the means for interleaving comprises:
means for grouping the encoded bits serially according to the asymmetry of the generating matrix.

12. The apparatus of claim 10, wherein the means for mapping is different for different modulation schemes.

13. The apparatus of claim 10, wherein the means for interleaving comprises:
means for matching a first set of encoded bits associated with a first channel reliability to a first portion of the modulation symbol; and
means for matching a second set of encoded bits associated with a second channel reliability to a second portion of the modulation symbol.

14. The apparatus of claim 10, wherein the means for mapping comprises:
means for using at least one of an anti-Gray mapping or a Gray mapping for a quadrature phase shift keying (QPSK) modulation scheme.

15. The apparatus of claim 10, wherein the means for mapping comprises:
means for using at least one of a natural binary mapping, or a random mapping, or a Gray mapping for a 16 quadrature amplitude modulation (16-QAM) modulation scheme.

16. The apparatus of claim 10, wherein the means for mapping comprises:
means for using a Gray mapping or a random mapping for a 2^2M quadrature amplitude modulation (2^2M-QAM) modulation scheme.

17. The apparatus of claim 10, wherein the means for performing polar coding comprises:
means for using a plurality of redundant polar coders to concurrently encode the plurality of bits, wherein each polar coder is associated with a different group of bits from the plurality of bits.

18. An apparatus for wireless communication, in a system comprising:
a processor;
memory in electronic communication with the processor; and
instructions stored in the memory and executable by the processor to cause the apparatus to:
perform polar coding to encode a plurality of bits, the polar coding associated with a plurality of component channels associated with a polar code length, wherein the plurality of component channels correspond to two or more pairs of encoded bits, each pair of encoded bits having a same erasure probability, and wherein a quantity of the component channels is based at least in part on the polar code length, and wherein the polar coding is based at least in part on an asymmetry of a generating matrix for encoding the plurality of bits;
interleave the encoded bits, wherein the instructions executable by the processor to cause the apparatus to interleave comprise instructions executable by the processor to cause the apparatus to reorder the encoded bits based at least in part on the asymmetry of the generating matrix and an ordering of a reliability of each component channel of the plurality of component channels resulting from the asymmetry of the generating matrix;
map the interleaved encoded bits to a modulation symbol, wherein the mapping of each encoded bit is based at least in part on the asymmetry of the generating matrix, and wherein the mapping is configured to polarize the reliability of each component channel of the plurality of component channels; and
transmit the interleaved encoded bits based at least in part on the mapping.

19. The apparatus of claim 18, wherein the instructions executable by the processor to cause the apparatus to interleave comprise instructions executable by the processor to cause the apparatus to:
group the encoded bits serially according to the asymmetry of the generating matrix.

20. The apparatus of claim 18, wherein the mapping is different for different modulation schemes.

21. The apparatus of claim 18, wherein the instructions executable by the processor to cause the apparatus to interleave comprise instructions executable by the processor to cause the apparatus to:
match a first set of encoded bits associated with a first channel reliability to a first portion of the modulation symbol; and
match a second set of encoded bits associated with a second channel reliability to a second portion of the modulation symbol.

22. The apparatus of claim 18, wherein the instructions executable by the processor to cause the apparatus to map comprise instructions executable by the processor to cause the apparatus to:
use at least one of an anti-Gray mapping or a Gray mapping for a quadrature phase shift keying (QPSK) modulation scheme.

23. The apparatus of claim 18, wherein the instructions executable by the processor to cause the apparatus to map comprise instructions executable by the processor to cause the apparatus to:
use at least one of a natural binary mapping, or a random mapping, or a Gray mapping for a 16 quadrature amplitude modulation (16-QAM) modulation scheme.

24. The apparatus of claim 18, wherein the instructions executable by the processor to cause the apparatus to map comprise instructions executable by the processor to cause the apparatus to:
use a Gray mapping or a random mapping for a 2^2M quadrature amplitude modulation (2^2M-QAM) modulation scheme.

25. The apparatus of claim 18, wherein the instructions executable by the processor to cause the apparatus to perform polar coding comprise instructions executable by the processor to cause the apparatus to:
use a plurality of redundant polar coders to concurrently encode the plurality of bits, wherein each polar coder is associated with a different group of bits from the plurality of bits.

26. A non-transitory computer readable medium storing code for wireless communication, the code comprising instructions executable by a processor to:
perform polar coding to encode a plurality of bits, the polar coding associated with a plurality of component channels associated with a polar code length, wherein the plurality of component channels correspond to two or more pairs of encoded bits, each pair of encoded bits having a same erasure probability, and wherein a quantity of the component channels is based at least in part on the polar code length, and wherein the polar coding is based at least in part on an asymmetry of a generating matrix for encoding the plurality of bits;
interleave the encoded bits, wherein the instructions executable by the processor to interleave comprise instructions executable by the processor to reorder the encoded bits based at least in part on the asymmetry of the generating matrix and an ordering of a reliability of each component channel of the plurality of component channels resulting from the asymmetry of the generating matrix;
map the interleaved encoded bits to a modulation symbol, wherein the mapping of each encoded bit is based at least in part on the asymmetry of the generating matrix, and wherein the mapping is configured to polarize the reliability of each component channel of the plurality of component channels; and
transmit the interleaved encoded bits based at least in part on the mapping.

27. The non-transitory computer readable medium of claim 26, wherein the instructions executable by the processor to interleave comprise instructions executable by the processor to:
grouping the encoded bits serially according to the asymmetry of the generating matrix.

* * * * *